(12) United States Patent
Dai

(10) Patent No.: US 8,593,237 B1
(45) Date of Patent: Nov. 26, 2013

(54) LOCALIZED TEMPERATURE STABILITY OF LOW TEMPERATURE COFIRED CERAMICS

(75) Inventor: Steven Xunhu Dai, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 311 days.

(21) Appl. No.: 13/245,535

(22) Filed: Sep. 26, 2011

(51) Int. Cl.
*H01P 7/08* (2006.01)

(52) U.S. Cl.
USPC .......................................................... 333/234

(58) Field of Classification Search
USPC .......................................................... 333/234
See application file for complete search history.

(56) References Cited

U.S. PATENT DOCUMENTS

| 5,302,924 A | 4/1994 | Jantunen et al. |
| 6,841,496 B2 | 1/2005 | Kim et al. |

OTHER PUBLICATIONS

N. MCN. Alford et al., Layered Al2O3-TiO2 Composite Dielectric Resonators with Tuneable Temperature Coefficient for Microwave Applications, IEEE Proc.-Sci. Meas. Technol., vol. 147, No. 6, Nov. 2000, pp. 269-273.

Young-Jin Choi et al., Middle-Permittivity LTCC Dielectric Compositions with Adjustable Temperature Coeffeicient, Science Direct Materials Letters 58 (2004) pp. 3102-3106.
Steve Xunhu Dai et al., Use of Titanates to Achieve a Temperature-Stable Low-Temperature Cofired Ceramic Dielectric for Wireless Applications, J. Am. Ceram. Soc., vol. 85, No. 4 (2002), pp. 828-832.
Heli Jantunen et al., Temperature Coefficient of Microwave Resonance Frequency of a Low-Temperature Cofired Ceramic (LTCC) System, J. Am. Ceram. Soc., vol. 85, No. 3 (2002), pp. 697-699.
Hiroshi Kagata et al., Low-Fire Bismuth-Based Dielectric Ceramics for Microwave Use, Jpn. J. Appl. Phys., vol. 31 (1992), pp. 3152-3155.
Ian M. Reaney and David Iddles, Microwave Dielectric Ceramics for Resonators and Filters in Mobile Phone Networks, J. Am. Ceram. Soc., vol. 89, No. 7 (2006), pp. 2063-2072.
Chi Wang and Kawthar A. Zaki, Temperature Compensation of Combline Resonators and Filters, 1999 IEEE MTT-S Digest, pp. 1041-1044.
Wolfram Wersing, Microwave Ceramics for Resonators and Filters, Solid State & Materials Science 1996, pp. 716-731.

*Primary Examiner* — Robert Pascal
*Assistant Examiner* — Kimberly Glenn
(74) *Attorney, Agent, or Firm* — Kevin W. Bieg

(57) ABSTRACT

The present invention is directed to low temperature cofired ceramic modules having localized temperature stability by incorporating temperature coefficient of resonant frequency compensating materials locally into a multilayer LTCC module. Chemical interactions can be minimized and physical compatibility between the compensating materials and the host LTCC dielectrics can be achieved. The invention enables embedded resonators with nearly temperature-independent resonance frequency.

15 Claims, 7 Drawing Sheets

LOCALIZED TEMPERATURE STABILITY OF LOW TEMPERATURE COFIRED CERAMICS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to low temperature cofired ceramics and, in particular, to a low temperature cofired ceramic having localized temperature stability.

BACKGROUND OF THE INVENTION

Low temperature cofired ceramic (LTCC) is a multilayer 3D packaging, interconnection, and integration technology. One of the advantages of LTCC is the ability to integrate passive components, such as capacitors, resistors, inductors, resonators, and filters, in the LTCC via cofiring processes. For LTCC modules with embedded resonator functions targeting high frequency applications, the temperature coefficient of resonant frequency ($\tau_f$) is a critical parameter. A low $\tau_f$, preferably close to 0 ppm/° C., is desirable to achieve temperature-stable resonator functions for radio and microwave frequency (RF and MW) applications. With a low $\tau_f$ resonator, the temperature compensation that requires additional mechanical and electrical circuits to achieve temperature stable resonator function can be eliminated. See C. Wang and K. A. Zaki, *IEEE MMT-S Intern. Microwave Sump, Digest* 3, 1041 (1993); and U.S. Pat. No. 5,302,924 to H. Johnson and A Tunumen. For filter applications, a low $\tau_f$ enables efficient use of bandwidth for maximum communication capacity.

There are multiple approaches to achieve temperature stable resonator functions. One common engineering method to achieve a near zero $\tau_f$ is to form solid solutions of different dielectric ceramics that have opposite $\tau_f$. The method has been applied to many MW dielectrics for resonator applications as well as LTCC base dielectrics for integration of resonator functions. See W. Wersing, *Solids State and Mat. Sci.* 1, 715 (1996); R. C. Kell et al., *J. Am. Ceram. Soc.* 56, 352 (1973); S. Kucheiko et al., *J. Am. Ceram. Soc.* 79, 2739 (1996); I. M. Reaney, and D. Iddles, *J. Am. Ceram. Soc.* 89, 2063 (2006); S. Dai et al., *J. Am. Ceram. Soc.* 85, 828 (2002); H. Jantunen, *J. Am. Ceram. Soc.* 85, 697 (2002); H. Kapta et al., *Jpn. J. Appl. Phv.* 31, 3152 (1992); Y. Choi et al., *Materials Letters* 58, 3102 (2004); and U.S. Pat. No. 6,841,496 to Kim. The other practice is to form a hybrid layered structure incorporating alternating layers with opposite $\tau_f$, either by sequential sintering or bonding processes. See N. Alford et al., *IEE Proc-Sci. Meas. Technol.* 147, 269 (2000); and L. Li and X. M. Chen, *J. Am. Ceram. Soc.* 89, 544 (2006).

Although there are commercial LTCC dielectrics with low $\tau_f$, (e.g., Hereaus CT2000 with $\tau_f$<10 ppm/° C.), most of existing LTCC dielectrics possess a $\tau_f$ in the range −50 to −80 ppm/° C. FIG. 1 shows $\tau_f$ data of several main stream LTCC dielectrics. It is expected that for integrated RF circuits using any of these LTCCs, the impact of $\tau_f$ will be reflected in a drift of resonant frequencies of embedded resonators over the device's operating temperatures. This drift results in extra design limitation and/or performance compromise.

Therefore, a need remains for an LTCC having localized temperature stability.

SUMMARY OF THE INVENTION

The present invention is directed to a multilayer low temperature cofired ceramic module having localized temperature stability, comprising a layer comprising a low temperature cofired ceramic having a temperature coefficient of resonant frequency; a passive component disposed on the low temperature cofired ceramic layer; and a compensating material having a temperature coefficient of resonant frequency opposite to that of the low temperature cofired ceramic, disposed on at least one side of the passive component. For example, the compensating material can be disposed as a layer, filled via, or cavity insert on at least one side of the passive component. The compensating material can comprise a glass, a ceramic filler, such as alumina, and titania or titanate. For example, the compensating material can comprise between 5 to 90 wt % of a low temperature cofired ceramic glass, between 0 to 90 wt % of ceramic filler, and between 0 to 90 wt % of titania or titanate. The multilayer low temperature cofired ceramic module can further comprise at least one additional compensating material having a different temperature coefficient of resonant frequency, disposed on another side of the passive component.

The low temperature cofired ceramics having localized temperature stability of the present invention enable zero or near zero $\tau_f$ embedded resonators by incorporating $\tau_f$ compensating materials locally into a multilayer LTCC structure. Chemical interactions can be minimized and physical compatibility between the $\tau_f$ modifiers and the host LTCC dielectrics can be achieved. Therefore, a stripline (SL) ring resonator with near zero $\tau_f$ can be fabricated in a non-zero $\tau_f$ commercial LTCC that is temperature compensated.

As an example of the present invention, the formation of proper $\tau_f$ compensating materials and subsequent successful cofiring of the materials in a DuPont 951 LTCC was demonstrated and SL resonators that have a near zero $\tau_f$ can be achieved. The compensation of the $\tau_f$ is realized locally inside a LTCC structure where the resonators reside. Therefore, existing LTCC material sets and processes can remain unchanged while incorporating the $\tau_f$ compensation materials.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

For high frequency applications, a ceramic module preferably has a high dielectric constant to enable a small resonator size, low dielectric loss to enable a high quality factor and narrow bandwidth, and a small temperature coefficient of resonant frequency to provide a temperature-independent resonance frequency. This is because many of the elements used in multilayer ceramic integrated circuits, such as filters and resonators, need to be very stable under drifts in temperature. The temperature coefficient of resonant frequency $\tau_f$ is a device parameter which can be expressed in basic material properties:

$$\tau_f = +\tfrac{1}{2}\tau_\in - \alpha \quad (1)$$

where $\tau_\in$ is the temperature coefficient of dielectric constant and $\alpha$ the coefficient of thermal expansion (CTE). For LTCC dielectrics, $\alpha$ is typically between 4-10 ppm/° C., therefore $\tau_\in$ dominates $\tau_f$.

From eq. (1) it is clear that $\tau_f$ and $\tau_\in$ have opposite signs. To compensate the negative $\tau_f$ of LTCC, materials with negative $\tau_\in$, and thus positive $\tau_f$ are necessary. Table 1 lists dielectric constant $\in$, $\tau_\in$, and normal sintering temperatures of candidate ceramics that could serve as compensating materials for LTCC dielectrics.

TABLE 1

Potential compensating materials.

| Materials | Dielectric constant | $\tau_\epsilon$ (ppm/° C.) | Sintering Temp (° C.) |
|---|---|---|---|
| $TiO_2$ | 110 | −750 | ~1200 |
| $CaTiO_3$ | 130 | −1600 | ~1400 |
| $SrTiO_3$ | 285 | −2400 | ~1550 |

A. J. Moulson and J. M. Herbert, *Electroceramics*, Chapman & Hall, p 234, 1990.

The present invention is directed to a means to adjust temperature coefficient by cofiring locally in the multilayer LTCC structure with a compensating dielectric with $\tau_f$ having opposite sign to that of host LTCC dielectric. The invention enables temperature compensation only in that portion of the LTCC structure where the resonator functions resides, without affecting other embedded functions where such implementation is not necessary or is undesirable. The invention can be applied to any existing LTCC with a proper selection and development of a cofireable compensating dielectric. A major advantage of this invention is that it enables the use of existing LTCC systems, such as cofireable conductors and other functional materials, without the need to revamp an entire cofireable LTCC material system.

Figure 1:
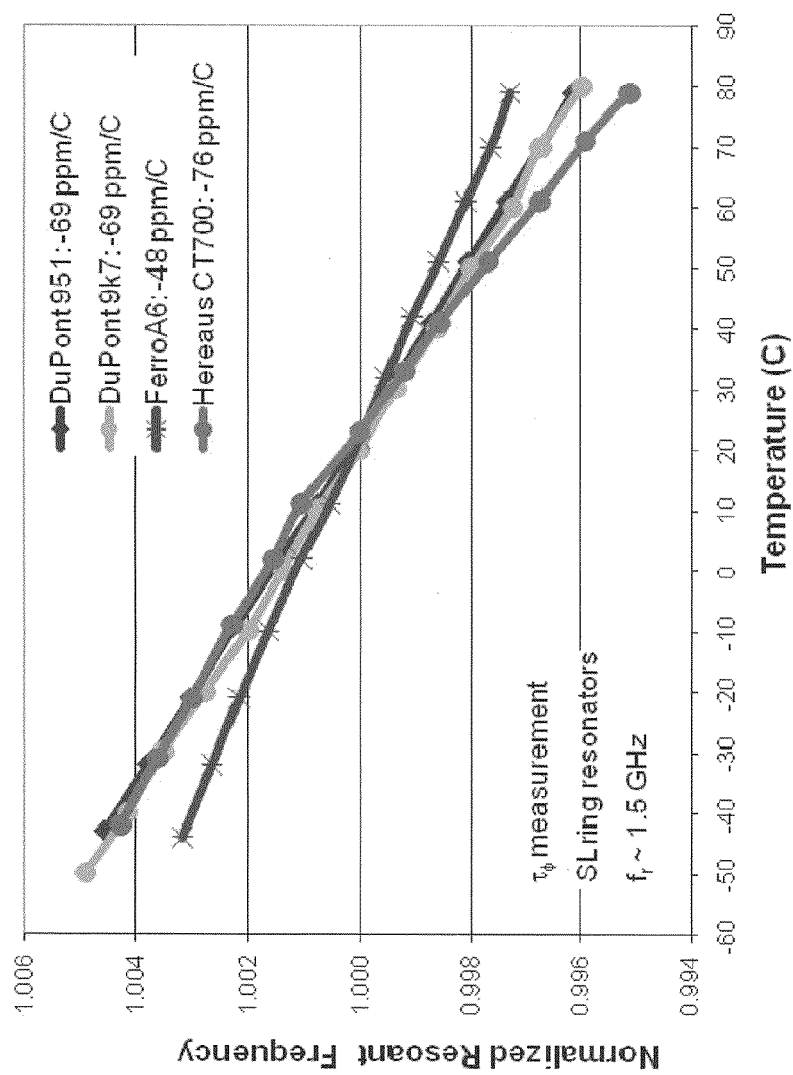
FIG. 1 is a graph of $\tau_f$ for several commercial LTCC base dielectrics. The resonant frequencies $f_r$ (all ~1.5 GHz) were collected from stripline ring resonators from −50 to 80° C. (X-axis) and normalized to $f_r$ at 20° C. (Y-axis). $\tau_f$ is the slope of the normalized frequency versus temperature curves.
Figure 2A:
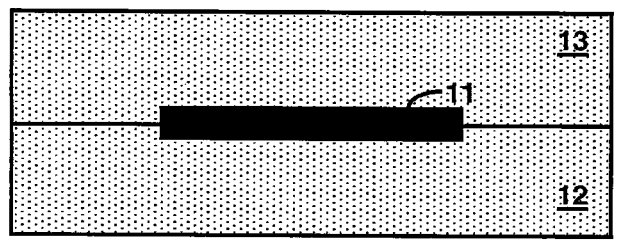
FIG. 2 are schematic side-view illustrations of exemplary embodiments providing for localized temperature stability of a LTCC module.
Figure 2B:
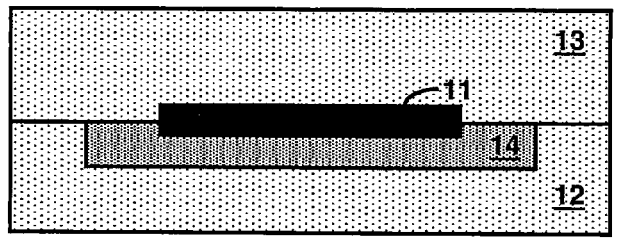
Figure 2C:
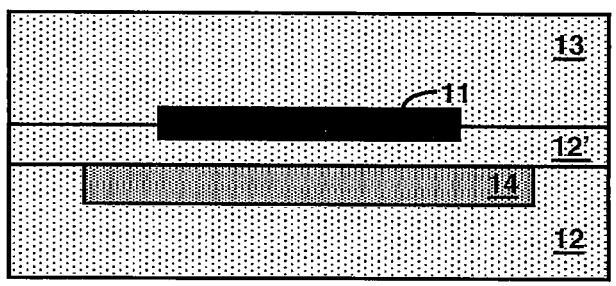
Figure 2D:
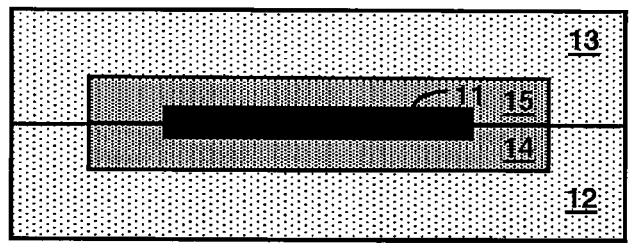
Figure 2E:
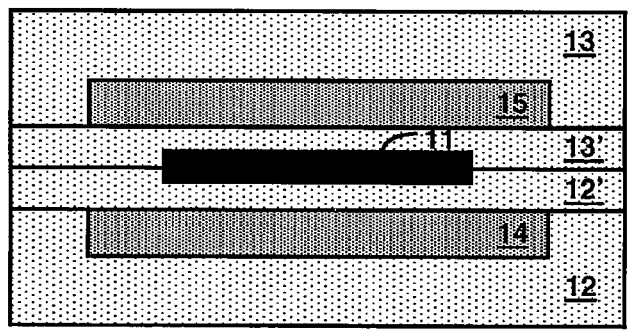
Figure 2F:
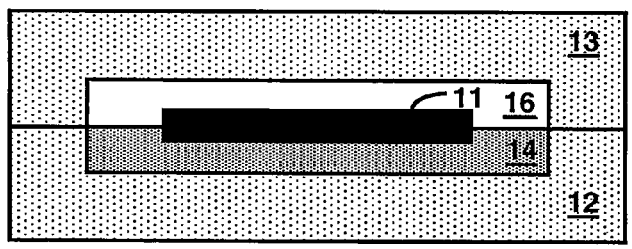
Figure 2G:
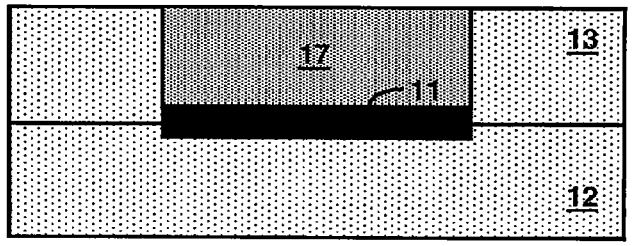

The present invention uses $\tau_f$ compensating materials and the cofiring of such materials in a LTCC module. FIG. 2a shows a schematic side-view illustration an uncompensated LTCC module comprising a passive component 11 embedded between LTCC layers 12 and 13. For example, the passive component 11 can be a filter or resonator. FIGS. 2b-g show some exemplary embodiments of the present invention. FIG. 2b shows a layer of compensating material 14 disposed on one side of the passive component 11 embedded between LTCC layers 12 and 13. As shown in FIG. 2c, one or more intervening LTCC layers 12' can separate the compensating material 14 from the passive component 11, so long as the electric field from the passive component 11 penetrates through the intervening LTCC layer 12' and the compensating material 14 to an electrical ground plane, for example, on the bottom surface of the module. Therefore, both the $\tau_f$ of the intervening LTCC layer and the $\tau_f$ of the compensating material can contribute to provide a near-zero overall $\tau_f$ at the passive component. FIG. 2d shows layers of compensating material 14 and 15 disposed on both sides of the passive component 11 embedded between LTCC layers 12 and 13. A different compensating material can be used on each side of the passive component. As shown in FIG. 2e, one or more intervening LTCC layers 12' and 13' can separate the compensating materials 14 and 15 from the passive component 11. FIG. 2f shows a layer of compensating material 14 on one side and an air gap 16 on the other side of the passive component 11 embedded between LTCC layers 12 and 13. Of course, the compensating material need not disposed as a layer on the passive component, but can be disposed on the passive component, for example, as a filled via 17 or an insert in a cavity in the LTCC layer, as shown in FIG. 2g.

As an example of the present invention, compensating glass-ceramic compositions in paste form were cofired in a commercial LTCC. Evidence of both physical compatibility, measured by matched shrinkage, and chemical compatibility, characterized by material interdiffusion, is provided to demonstrate the cofireability. Stripline ring resonators in LTCC were fabricated and characterized to quantify the effect of temperature compensation.

Compensating Materials

Several commercial LTCC glasses were evaluated. The main requirement is that the chemical constituents and glass softening point $T_g$ of the LTCC match the onset temperature of shrinkage of the compensating material. One LTCC glass, designated as V-glass, was used as an example of the present invention. V-glass consists essentially of $Al_2O_3$, $BaO_3$, CaO, PbO, MaO and $SiO_2$. V-glass has density of 2.77 g/cm³, coefficient of thermal expansion of 5.5 ppm/° C., dielectric constant of 7.3 and glass transition temperature $T_g$=625° C. Table 2 lists the formulations of candidate compensating materials. For this example, the weight % of V-glass was fixed at 55%. The base formulation was 55 wt % V-glass+45 wt % $Al_2O_3$. To demonstrate the invention, portions of the $Al_2O_3$ were replaced by different titanates at several weight percentages to form 5' a series of compositions. The mixture of V-glass, $Al_2O_3$ and titanate was co-milled using $Al_2O_3$ media to a median particle size 2.0 to 2.2 μm. For dielectric property measurement pellets at φ12.5×1 mm from dry co-milled powder with binders were pressed using a 2-step process: a uniaxial press at 5000 psi, followed by an isostatic press at 30000 psi. The pellets were sintered at 850° C./30 min in air. Au was sputtered on polished pellets to form electrodes.

Pastes of selected compensating materials were made using an organic vehicle ESL441 combined with thinner ESL401 (both from Electro-Science Labs) and a 3-roll mixing step. The pastes were screen printed on green LTCC tapes below and/or over conductor lines to form temperature compensation layers.

TABLE 2

Formulation of compensating materials.

| Composition | V-glass (wt %) | Al$_2$O$_3$ (wt %) | TiO$_2$ (wt %) | CaTiO$_3$ (wt %) | SrTiO$_3$ (wt %) |
|---|---|---|---|---|---|
| Base | 55 | 45 | | | |
| TO10 | 55 | 35 | 10 | | |
| TO30 | 55 | 15 | 30 | | |
| CTO10 | 55 | 35 | | 10 | |
| CTO20 | 55 | 25 | | 20 | |
| STO10 | 55 | 35 | | | 10 |
| STO20 | 55 | 25 | | | 20 |

TABLE 3

Density and dielectric properties of compensating materials. $\tau_f$ is calculated from $\tau_c$ using eq. (2) assuming an $\alpha$ of 7 ppm/° C.

| Sample | Archimedes bulk density (g/cc) | Dielectric constant (1 MHz) | $\tau_c$ (ppm/° C.) | $\tau_f$ (ppm/° C.) |
|---|---|---|---|---|
| Base | 3.19 | 7.8 | 190 | −98.5 |
| TO10 | N/A | | | |
| TO30 | 2.77 | | | |
| CTO10 | 3.20 | 9.7 | 83 | −44.9 |
| CTO20 | 3.15 | 12.0 | −58 | 25.5 |
| STO10 | 3.21 | 9.6 | 10 | −8.7 |
| STO20 | 3.30 | 12.2 | −240 | 116.7 |

LTCC and SL Resonator 10 mil DuPont 951 LTCC tapes were used with this exemplary material. Conductors included DuPont 5738 Au for via fill, 5734 Au for internal lines and 6143 Ag/Pd for post fired external metallization. SL ring resonators at a designed base resonance of 1.5 GHz were fabricated in 4-layer 951 panels. All panels were laminated under a standard process of 3000 psi isostatic pressure at 70° C. for 10 minutes. Panels were sintered at 850° C./30 min in air on Al$_2$O$_3$ setters. Sub-miniature version A (SMA) edge connectors were soldered to resonator panels to access the embedded ring resonator for resonant frequency measurement.

Capacitance of the compensating materials was measured on sintered pellets using an HP4194A impedance/gain-phase analyzer at 1 MHz inside a temperature chamber. The $\tau_f$ was calculated from $$\tau_f = -\tfrac{1}{2}(\tau_c + \alpha) \quad (2)$$

where $\tau_c$ is the temperature coefficient of capacitance and $\alpha$ the CTE.

Shrinkage data of the compensating materials, in the form of cylinders at $\phi 6.25 \times 5$ mm, and the 951 dielectric, in the form of 5×5 mm stack of 20 layer tapes, were measured using a Netzsch DIL 402 dilatometer. A scanning electron microscope (SEM) was used to analyze microstructure and interface of the cofired materials.

The SL resonators were placed inside a temperature chamber and characterized using an Agilent E5062A network analyzer from −50 to 80° C. The resonant frequency $f_r$ was obtained as the minimum frequency of the reflection coefficient (S11) of the ring resonator. $\tau_f$ was calculated using the following equation, $$\tau_f = \frac{1}{f_{ro}} \left( \frac{\Delta f_r}{\Delta T} \right) \quad (3)$$

where $f_{ro}$ is the resonant frequency at 20° C., $\Delta f_r$ is the change of resonant frequency over −50 to 80° C., and $\Delta T$ equals to 130° C.

Selection of Compensating Materials

Figure 3:
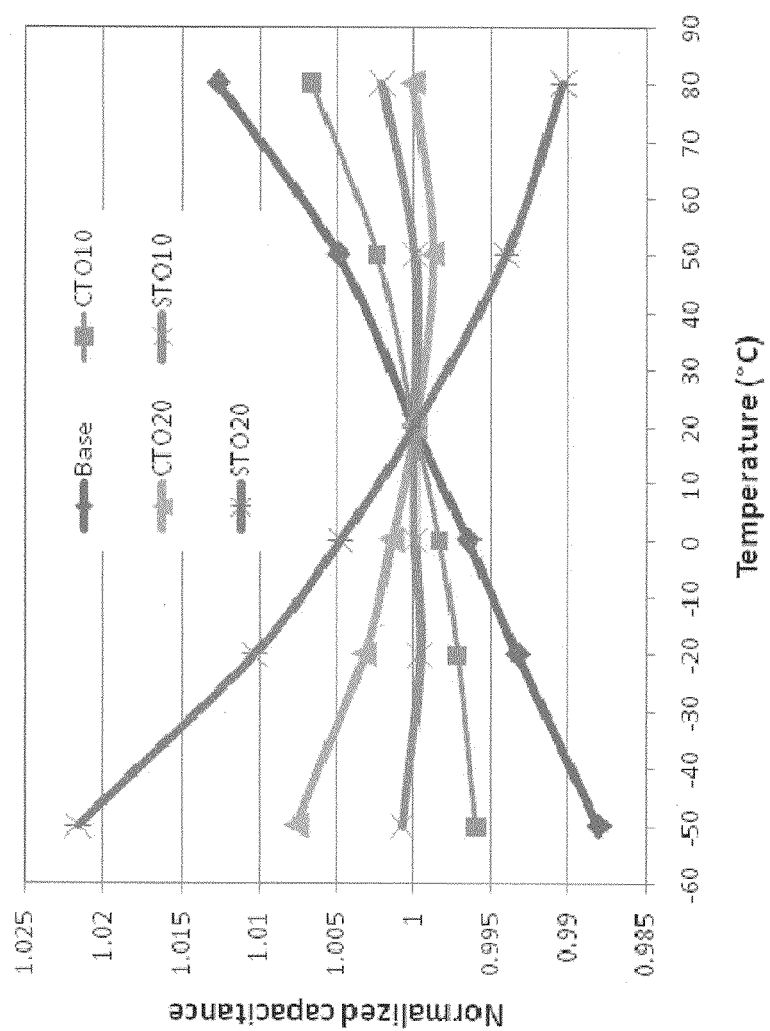
FIG. 3 is a graph of the normalized capacitance and correspondent temperature coefficient of capacitance $\tau_c$ of compensating materials.

Archimedes bulk density and dielectric constant of the sintered compensating materials are listed in Table 3. Both TO10 and TO30 showed a lack of adequate densification. FIG. 3 displays normalized capacitance, scaled to the capacitance value at 20° C., of compositions CTO10, CTO20, STO10 and STO20 over the temperature range −50° C. to 80° C. $\tau_c$ and calculated $\tau_f$ of these compositions are also listed in Table 3.

The base dielectric has a $\tau_c$ of 190 ppm/° C. and a $\tau_f$ of −98.5 ppm/° C. Therefore, without the addition of titanates, the base dielectric has a higher $\tau_f$ than the 951 LTCC. With the addition of 10 wt % of titanates, the CTO10 and STO10 still show positive $\tau_c$, and thus negative $\tau_f$. Obviously, the polarity of $\tau_f$ of these two compositions is the same as that of the 951 LTCC. Therefore, these compositions were not expected to adjust the $\tau_f$ towards zero, and were eliminated from further consideration. With a higher weight percentage of titanates, the CTO20 and STO20 reach a $\tau_f$ of 25.5 ppm/° C. and 116.5 ppm/° C., respectively. Considering that the 951 LTCC has a $\tau_f$ of −69 ppm/° C., the STO20 is expected to be more effective for $\tau_f$ compensation, and was thus down-selected for a cofiring study and for the fabrication of proof-of-concept SL ring resonators.

Cofireability of STO20 and 951 LTCC

Figure 4:
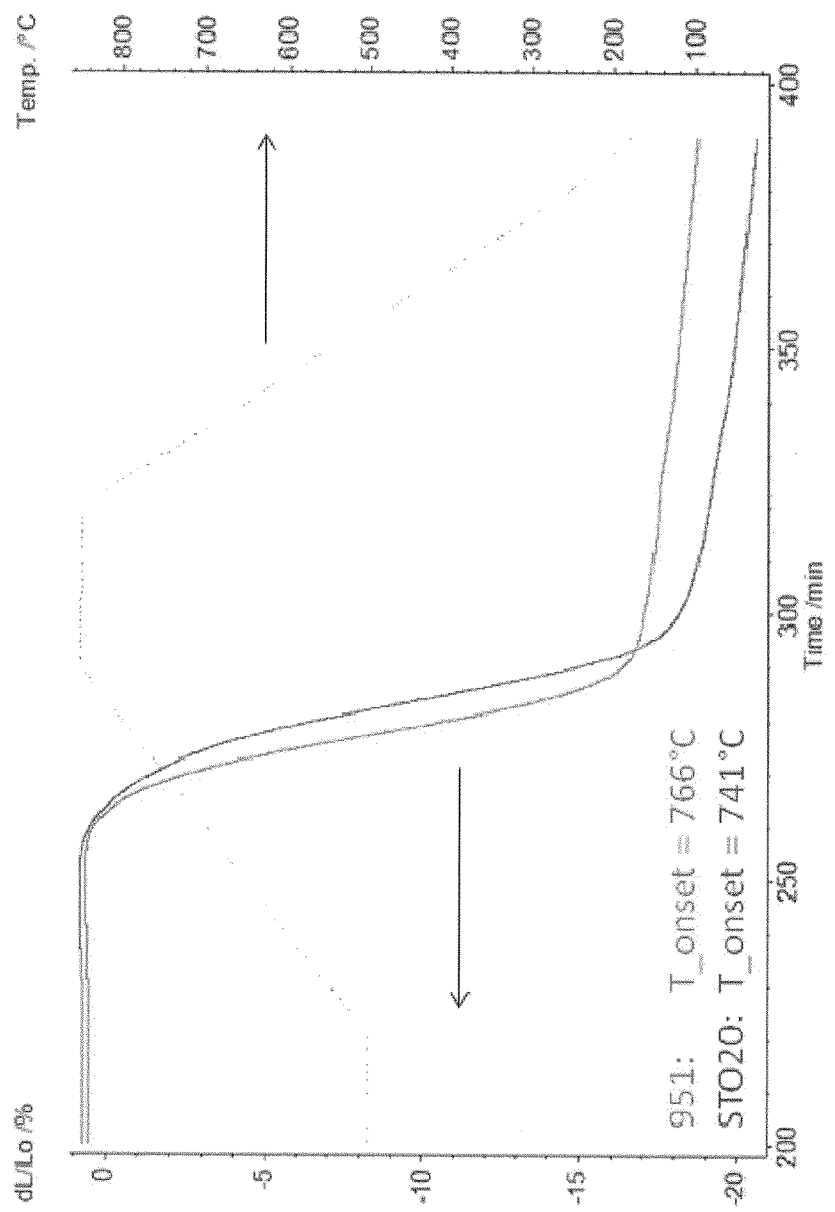
FIG. 4 is a graph of shrinkage curves and onset temperature of shrinkage of STO20 and 951 LTCC.

FIG. 4 shows shrinkage curves of STO20 and 951 along the Z-direction (thickness of the tape) at a heating rate 5° C./min from 500 to 850° C. The onset temperature of shrinkage of STO20, measured from a shrinkage-versus-temperature plot, is 741° C. Among all evaluated LTCC glasses this onset temperature of V-glass based STO compositions represents the closest match to the onset temperature 766° C. of 951 LTCC. The proximity of these onset temperatures provides a solid physical base for cofiring of STO20 in 951 LTCC.

Figure 5:
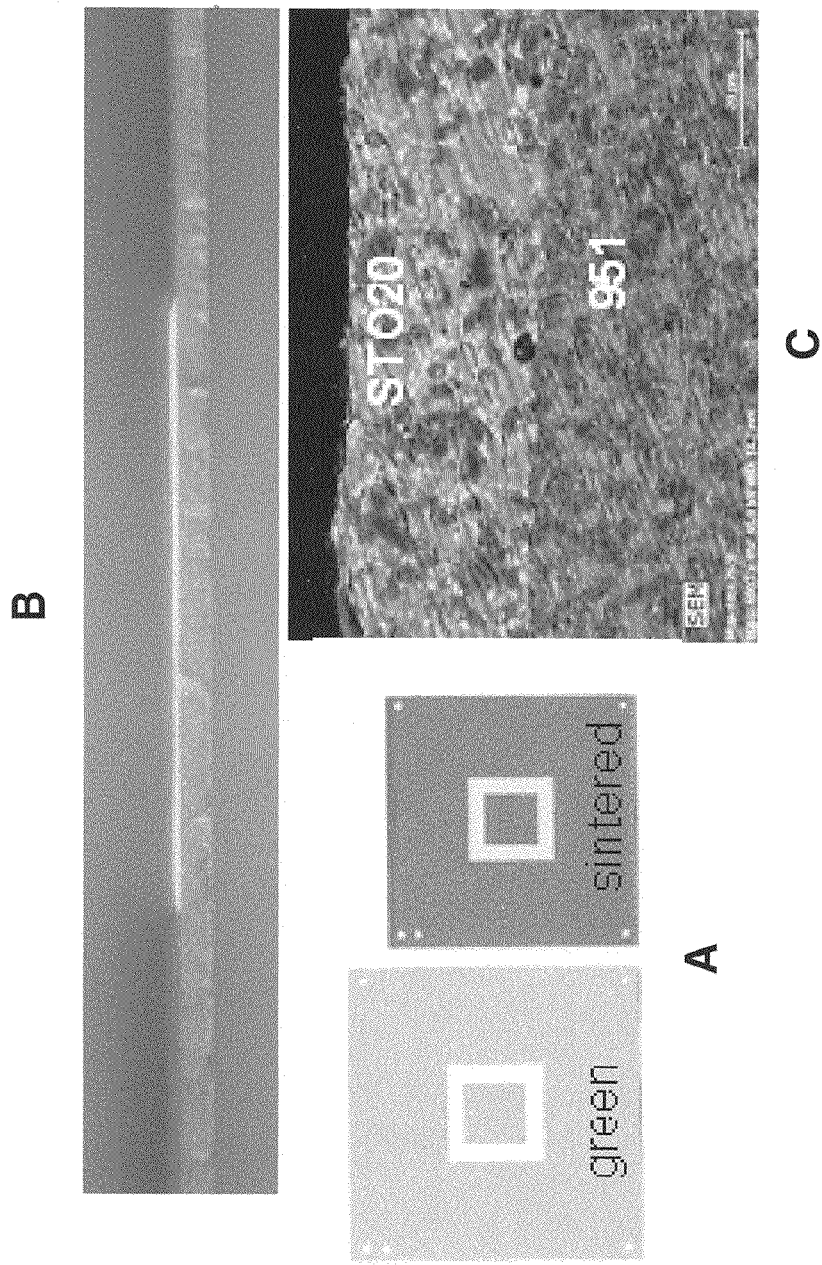
FIG. 5 shows optical and scanning electron microscopy images of STO paste on single layer 951 tape and SEM cross section.

To validate cofireability of STO20 with 951, the STO20 paste was screen printed on a 3"×3" 951 single layer tape in a square ring pattern and sintered using a normal profile, as shown in FIG. 5A. FIG. 5B shows an optical image of a fractured cross section of the cofired structure. No deformation, either in 951 or in STO20, is visible, indicating a well matched sintering behavior. A close look at the STO20-951 interface by SEM is also presented in FIG. 5C. A relatively clean interface exists between the two cofired materials, suggesting no or minimum interaction and interdiffusion between the two.

Temperature Compensated SL Ring Resonators

Figure 6:
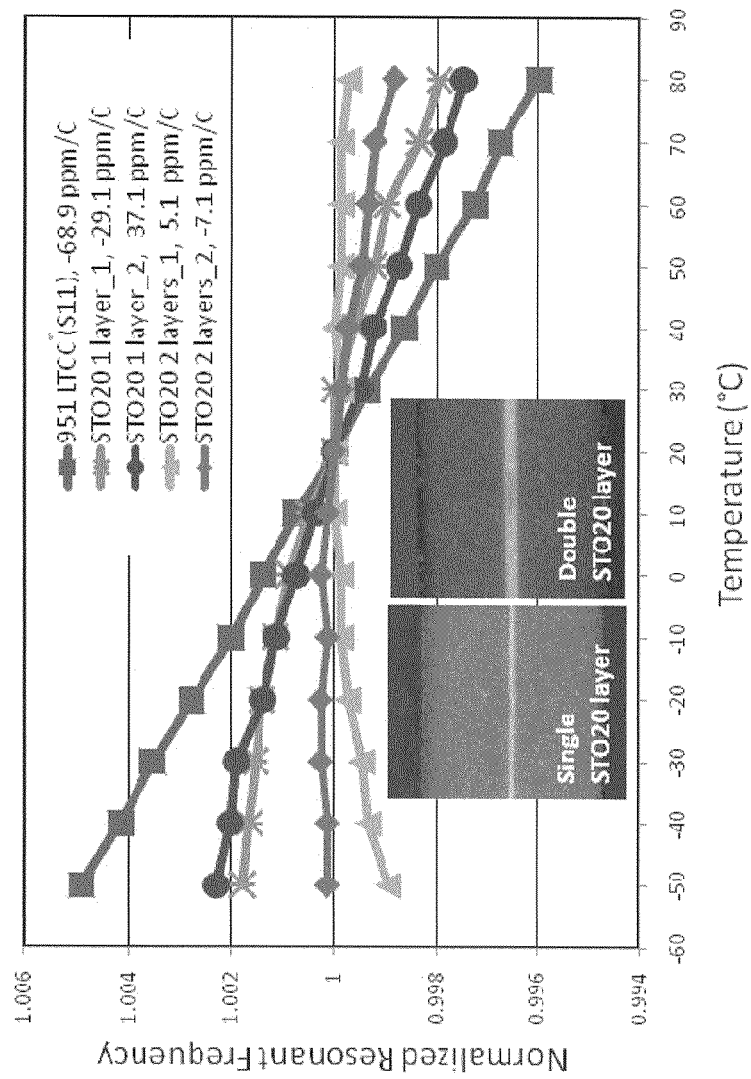
FIG. 6 is a graph of normalized resonant frequencies versus temperature and $\tau_f$ data of SL line resonators in 951 LTCC, 951 with cofired single STO layer, and 951 with double surrounding STO20 layers. The inserts show cross section of resonator lines.

The normalized resonant frequency versus temperature and correspondent $\tau_f$ data of 5 resonators are shown in FIG. 6: a resonator in 951 LTCC; two duplicated resonators with a single STO20 print on one side of the resonator line (STO20 1 layer); and two duplicated resonators with STO20 printed on both sides of the resonator line (STO20 2 layers). The inserts are cross section images that show details of the layered structures.

The 951 LTCC possesses a $\tau_f$ at −68.9 ppm/° C. With the incorporation of single layer STO20, the $\tau_f$ drops to 29.1 and 37.1 ppm/° C. for the two evaluated samples. The variation in $\tau_f$ data may come from the actual thickness changes of the STO20 layer between different resonator builds. Overall, a single STO20 layer cofired next to the resonator conductor line reduces the $\tau_f$ value of the non-compensated 951 LTCC approximately in half.

For the two resonators where the conductor lines are surrounded by the STO20 dielectric layers, one shows a $\tau_f$ of 5.1 ppm/° C. and the other a $\tau_f$ of −7.1 ppm/° C. The incorporation of two STO20 layers brings the $t_f$ close to zero. Again, the variation of $\tau_f$ of the two samples may reflect the thickness variation of the printed STO20 layers. The fact that one resonator possesses a slightly positive $\tau_f$ and the other a slightly negative $\tau_f$ suggests that with a tight control on the thickness of the STO20 layer resonators with a true near zero or at zero $\tau_f$ are achievable.

The present invention has been described as a method for localized temperature stability of low temperature cofired ceramics. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A multilayer low temperature cofired ceramic module having localized temperature stability, comprising:
   a layer comprising a low temperature cofired ceramic having a temperature coefficient of resonant frequency;
   a passive component disposed on the low temperature cofired ceramic layer; and
   a compensating material having a temperature coefficient of resonant frequency opposite to that of the low temperature cofired ceramic, disposed on at least one side of the passive component.

2. The multilayer low temperature cofired ceramic module of claim 1, wherein the compensating material is disposed as a layer, filled via, or cavity insert on at least one side of the passive component.

3. The multilayer low temperature cofired ceramic module of claim 1, wherein the compensating material comprises a glass.

4. The multilayer low temperature cofired ceramic module of claim 1, wherein the compensating material comprises a ceramic filler.

5. The multilayer low temperature cofired ceramic module of claim 4, wherein the ceramic filler comprises alumina.

6. The multilayer low temperature cofired ceramic module of claim 1, wherein the compensating material comprises titania.

7. The multilayer low temperature cofired ceramic module of claim 1, wherein the compensating material comprises a titanate.

8. The multilayer low temperature cofired ceramic module of claim 7, wherein the titanate comprises calcium titanate, strontium titanate, or a combination thereof.

9. The multilayer low temperature cofired ceramic module of claim 1, wherein the compensating material comprises between 5 and 90 wt % of a low temperature cofired ceramic glass and between 0 and 90 wt % of titania.

10. The multilayer low temperature cofired ceramic module of claim 1, wherein the compensating material comprises between 5 and 90 wt % of a low temperature cofired ceramic glass and between 0 and 90 wt % of titanate.

11. The multilayer low temperature cofired ceramic module of claim 10, wherein the titanate comprises calcium titanate, strontium titanate, or a combination thereof.

12. The multilayer low temperature cofired ceramic module of claim 1, wherein the temperature coefficient of resonant frequency of the compensating material is positive.

13. The multilayer low temperature cofired ceramic module of claim 1, further comprising at least one additional compensating material having a different temperature coefficient of resonant frequency, disposed on another side of the passive component.

14. The multilayer low temperature cofired ceramic module of claim 1, further comprising at least one intervening low temperature cofired ceramic layer disposed between the passive component and the compensating material.

15. The multilayer low temperature cofired ceramic module of claim 1, wherein the passive component comprises a filter or resonator.

* * * * *